United States Patent [19]

Brightman et al.

[11] Patent Number: 4,482,817
[45] Date of Patent: Nov. 13, 1984

[54] BILATERAL ELECTRONIC SWITCH

[75] Inventors: Barrie Brightman; Frank Niertit, both of Casselberry; Joseph A. Hartman, Longwood, all of Fla.

[73] Assignee: Stromberg-Carlson, Longwood, Fla.

[21] Appl. No.: 335,649

[22] Filed: Dec. 30, 1981

[51] Int. Cl.³ .............................................. H03K 17/74
[52] U.S. Cl. ................... 307/257; 307/259; 307/311; 179/16 AA
[58] Field of Search ............ 307/256, 257, 259; 179/186 F, 18 A, 18 FA, 16 AA; 363/126

[56] References Cited

U.S. PATENT DOCUMENTS

| | | | |
|---|---|---|---|
| 3,071,655 | 1/1963 | Lanham | 307/257 |
| 3,071,701 | 1/1963 | Perreault | 307/257 |
| 3,183,435 | 5/1965 | Donville et al. | 328/26 |
| 3,597,633 | 8/1971 | Hirano | 307/259 |
| 3,700,926 | 10/1972 | Dalley | 307/257 |
| 3,858,057 | 12/1974 | Martins | 307/257 |
| 3,973,143 | 8/1976 | Embree et al. | 307/257 |

Primary Examiner—Stanley D. Miller
Assistant Examiner—B. P. Davis
Attorney, Agent, or Firm—Cesari and McKenna

[57] ABSTRACT

A bilateral, low loss, wide band, switching circuit controls the transfer of a signal between two terminals. The balance points of a bilateral current gate connect to the terminals. A rectifier forward-biases the bilateral current gate when a controllable switching element forms a return path from the bilateral current gate to the rectifier. When the rectifier is energized, control circuitry closes the conductive path through the switching element to forward-bias diodes in the bilateral current gate so it operates as a modulator in which the signal to be switched is modulated onto the bias current from the rectifier.

8 Claims, 2 Drawing Figures

BILATERAL ELECTRONIC SWITCH

BACKGROUND OF THE INVENTION

This invention generally relates to electrical switching circuits and more specifically to bilaterally conducting, wide band, low loss, low distortion electronic switching circuits.

Telephone switching networks incorporate a wide variety of electrical switching elements. Many times these switching elements must be constituted by bilateral, wide band, low loss, low distortion switching elements. Conventionally, these switching elements comprise electromechanical relays and related circuits. When the contacts on a relay close, the resulting metal-to-metal connection forms a conductive path that produces essentially no loss of and no distortion to any signal passing through the contacts and that allows bilateral signal transmission over a wide range of frequencies. The contacts can withstand voltage and current levels that are dependent only on the rating of the contacts themselves. Moreover, these relays provide lightning and other transient signal protection because the transient signals on the conductive path are inherently isolated from the control circuitry that connects to a relay coil.

Unfortunately, such electromechanical devices have a number of known characteristics that are detrimental in many applications including telephony applications. Life expectancy of a relay depends upon contact wear. As contact wear is not predictable on an accurate basis, it is difficult to predict relay life. Moreover, electromechanical relays tend to be expensive, and this expense is subject to high cost multiples in telephone switching networks where one such relay can be used for each of the many telephone lines connected to the telephone switching network. Electromechanical relays also increase other manufacturing costs as they are discrete elements and must be mounted on circuit boards individually.

Other special switching circuits have been proposed from time to time to replace the electromechanical relay. Reversely poled, silicon-controlled rectifier and other transistor circuits have been suggested. However, in many telephone applications analog voice signals pass through such a switching circuit and the reversely poled transistor and SCR circuits introduce a crossover distortion as these circuits tend to stop conducting near the zero voltage, or current crossover, point. Circuitry can be added to compensate such distortion. However, this and other circuitry that may be necessary to provide proper operation increase the overall costs of manufacture.

More recently, a gated diode switch has been proposed that can be manufactured with large scale integration manufacturing techniques. The large number of such switches in telephone switching networks makes the use of large scale integration manufacturing techniques highly desirable, especially in view of the attendant cost savings that can be achieved. The proposed switch, however, has certain disadvantages. First, this circuit requires high voltages in the orders of up to 600 volts. When the switch is located in the standard tip and ring conductors to and from a subscriber's handset, certain precautions must be taken to protect customers and telephone company personnel against inadvertent contact with these voltages. This switching circuit also requires three separate voltages and this, of course, introduces complexities in the power supplies that serve the telephone switching network. Moreover, it would appear from available information that the proposed switch may require compensation for crossover distortion when the switching circuit conveys analog voice signals.

SUMMARY OF THE INVENTION

Therefore, it is an object of this invention to provide a bilateral, low loss, wide band, switching circuit of an improved design.

Yet another object of this invention is to provide a bilateral, low loss, wide band, switching circuit that is adapted for use in telephone switching networks.

Still another object of this invention is to provide a bilateral, low loss, wide band switching circuit that can be manufactured by large scale integration manufacturing techniques.

Yet still another object of this invention is to provide a bilateral, low loss, wide band switching circuit that is capable of switching balanced and unbalanced lines.

Still yet another object of this invention is to provide a bilateral, low loss, wide band switching circuit that introduces substantially no distortion to a signal passing through the switch.

Yet still another object of this invention is to provide a bilateral, low loss, wide band switching circuit that is capable of switching signals of reasonably high voltage and current levels.

Still yet another object of this invention is to provide a bilateral, low loss, wide band switching circuit that isolates a signal being switched from a control circuit.

A bilateral, low loss, wide band switching circuit constructed in accordance with this invention conveys signals between first and second terminal means in response to a switching signal at a third terminal. The first and second terminals are balance point junctions in a bilateral current gate that comprises a bridge of four conventional diodes. The other junctions of the bridge are placed in a series path with a switchably controlled DC bias circuit. The DC bias current is produced in response to a switching signal applied to the aforesaid third terminal, and forward biases the diodes in the bilateral current gate. As a result, the signals across the first and second terminal means produce a current that is less than the DC bias current through the diodes, the signals pass between the first and second terminals in either direction with negligible loss and over a wide range of frequencies.

This invention is pointed out with particularity in the appended claims. The above and further objects and advantages of this invention may be better understood by referring to the following description taken in conjunction with the accompanying drawings.

DESCRIPTION OF AN ILLUSTRATIVE EMBODIMENT

Figure 1:
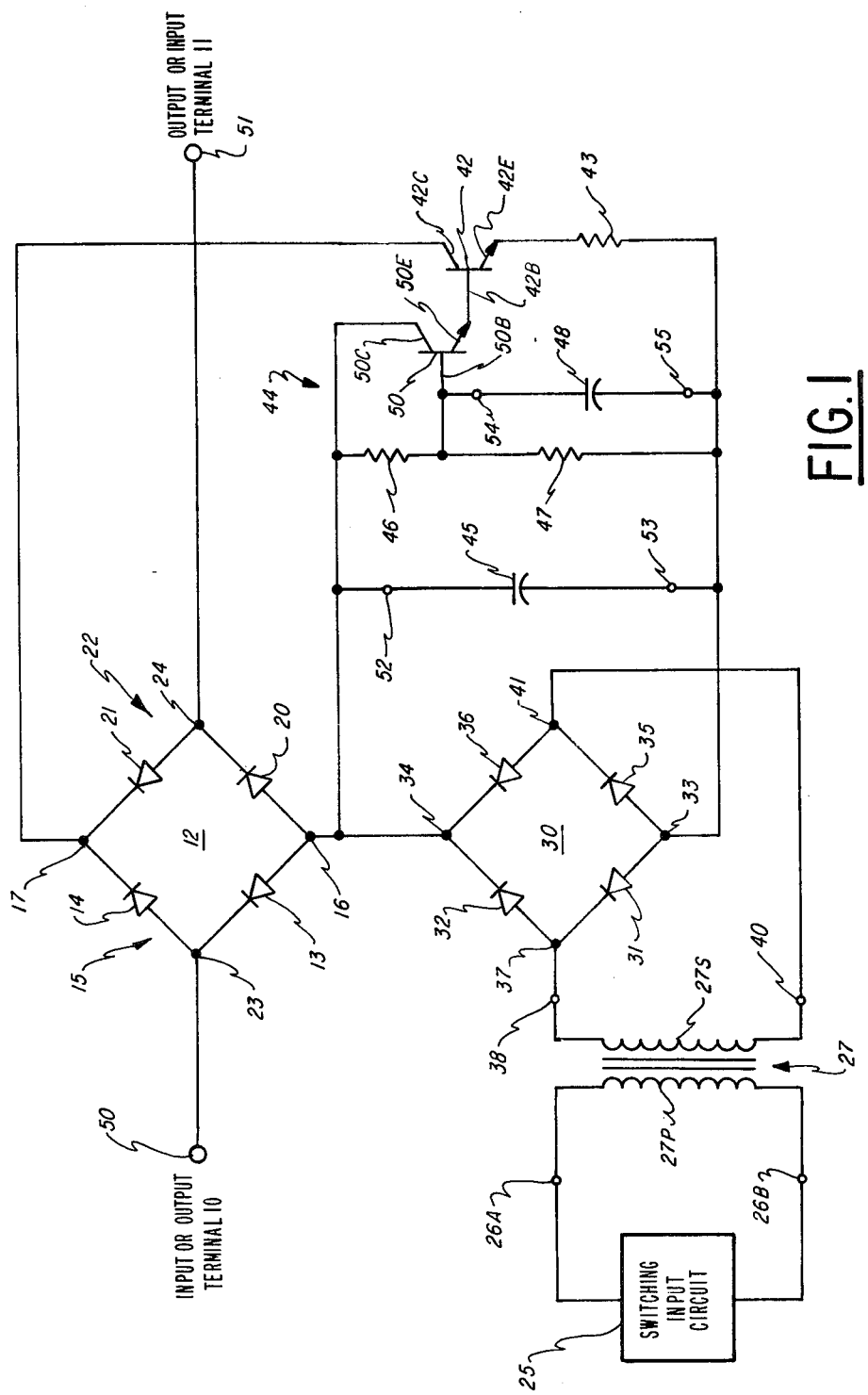
FIG. 1 is a circuit diagram of a bilateral switching circuit constructed in accordance with this invention and that is adapted for use in an unbalanced line.

Referring to FIG. 1, the switching circuit interconnects a first terminal 10 and a second terminal 11 that are adapted to carry a DC or AC signal having a predetermined range of current and voltage ratings. Terminal 10 is designated an "input or output" terminal while terminal 11 is denoted an "output or input" terminal, to designate the bilateral nature of the switching circuit. That is, if an input signal is applied to terminal 10, terminal 11 is an output terminal. If an input signal is applied to terminal 11, it is an input terminal while terminal 10 is an output terminal.

These signals pass through a bilateral current gate 12 that includes a plurality of diodes. Diodes 13 and 14 connect in series and define a unidirectional current path 15 for conducting a bias current, in conventional terms, from a first junction 16 to a second junction 17. Diodes 20 and 21 form a second current path 22 that is in parallel with the current path 15 and that also conducts a bias current from the first junction 16 to the second junction 17.

A junction 23, formed by the cathode of diode 13 and the anode of diode 14, connects to the input-output terminal 10, while a fourth junction 24, formed by the anode of cathode of the diode 20 and the anode of the diode 21, connects to output-input terminal 11. Third and fourth junctions 23 and 24 are at the balance points on the bilateral current gate 12 and are also called balance point junctions. Junctions 16 and 17 constitute input and output junctions, respectively.

In the bilateral current gate 12, the reverse breakdown voltages of the diodes normally exceed the voltages normally produced by lightning and other transients. Thus, the bilateral current gate 12 inherently protects the switch from such transients.

Still referring to FIG. 1, an AC control signal from a switching input circuit 25 is applied to a third terminal means shown, in FIG. 1, as comprising terminals 26A and 26B. An isolating transformer 27 contains a primary winding 27P and a secondary winding 27S. The primary winding 27P connects to the terminals 26A and 26B. The secondary winding 27S connects to a full-wave rectifier circuit 30.

The full-wave rectifier circuit 30 comprises diodes 31 and 32 in series from a first junction 33 to a second junction 34. Diodes 35 and 36 also are in series from the first junction 33 to the second junction 34. A junction 37, formed between diodes 31 and 32, connects to a terminal 38 from the secondary winding 27S, while another terminal 40 of the secondary 27S connects to another junction 41, formed by diodes 35 and 36. Junctions 37 and 41, therefore, constitute the balance point junctions for the bridge 30 and are driven by the AC control signal from the transformer 27.

When the switching input circuit 25 energizes the transformer 27, a DC voltage is produced across the first and second junctions 33 and 34 that are output junctions of the rectifier circuit 30. The rectifier circuit 30 energizes a controllable switching circuit including an output switching transistor 42, thereby to complete a DC bias path from the output junction 17 of the bilateral current gate 12 through a resistor 43 and the rectifier circuit 30. Thus, when the transistor 42 conducts, DC bias current from the rectifier circuit 30 forward biases the diodes in both the first and second unidirectional current paths 15 and 22 associated with the bilateral current gate 12.

More specifically, the energization of the rectifier circuit 30 by the switching input circuit 25 energizes a control circuit 44. Resistors 46 and 47 form a voltage divider across the rectifier circuit 30. The capacitor 45, another capacitor 48, and the resistors 46 and 47 filter ripple in the DC voltage from the rectifier circuit 30 to provide a DC voltage at a base electrode 50b of an NPN transistor 50. The collector 50c connects to the output junction 34 of the rectifier circuit 30 and is energized by this DC voltage. When the rectifier circuit 30 is energized, it forward biases the base-emitter junction of the transistor 50 and establishes a low-impedance path between the collector 50c and the emitter 50e. The emitter 50e connects directly to the base 42b of the output transistor 42 and produces a nearly zero impedance path from the collector 42c to the emitter 42e thereby to "close" the switch formed by transistor 42.

When the switching input circuit 25 does not apply a switching input signal, the rectifier circuit 30 is deenergized and the transistor 42 assumes a nonconducting state. If the terminal 10 is driven to a positive level with respect to the terminal 11, diodes 21 and 13 are back-biased and produce a high-impedance path. The only other path is through the diode 14, the resistor 42, the rectifier circuit 30, and the diode 20, but this also is a high-impedance path because the transistor 42 is in a non-conducting state. Similarly, if the terminal 11 is at a positive level with respect to the terminal 10, the diodes 14 and 20 are back-biased. Thus, so long as the switching transistor 42 is in a non-conductive state, there is no low-impedance path through the bilateral current gate 12 and its control circuitry. When the switching input circuit 25 is energized, all the diodes in the bilateral current gate 12 are forward-biased by the bias current. As this bias current "opens" and "closes" the circuit 12, the junctions 16 and 17 can also be considered as input and output gating terminals and the bias current can be considered as a gating signal or current. For any given application, the resistor 43 is selected to establish a bias current through the bilateral current gate 12 that exceeds the maximum signal current to be transferred through the switch. Under all normal operating conditions, the diodes are always forward-biased and conducting current. A signal at the input-output terminal 10 will transfer through the bilateral current gate 12 to the output-input terminal 11 and vice versa. The bilateral current gate 12 might also be considered as a quad modulator with a dc carrier supplied from the rectifier circuit 30.

Signals pass through the bilateral current gate 12 without any appreciable signal loss, as the signal is superimposed, or modulated, on the bias current. Problems with crossover distortion are eliminated because the diodes in the bilateral current gate 12 are always conducting over the range of input signals. Only one supply voltage is required, and that is the voltage produced by the switching input circuit.

This circuit can switch the wide range of voltage and current levels that are associated with telephone switching systems. A wide range of input signal frequencies are accommodated by this circuit as the upper frequency limit depends only upon the frequency characteristics of the diodes in the bridge circuit 12. Conventional diodes provide a range of frequencies that is sufficient for telephone applications.

The transformer 27 provides full isolation between the input circuit 25 and the telephone circuit represented by the terminals 10 and 11. Specifically, there is no direct connection between the switching input circuit 25 and any circuitry connected to the secondary 27S. As a result, the DC bias circuit "floats" with respect to the signals at the terminals 10 and 11. This enables the DC bias voltage to be a very low voltage and, in one application, the DC bias voltage is about six volts. The voltage need only be sufficiently high to overcome the forward voltage drops of the circuits 12 and 30, the output transistor 42, and the resistor 43 and to sustain a required bias current through the DC impedence of the path. The signals impose no requirement except to establish the required level of the bias current at the terminals. Other forms of isolation, such as optoelectrical devices, can also be used. When devices such as optoelectrical devices are utilized, other power supplies must be used in conjunction with the switching device.

Figure 2:
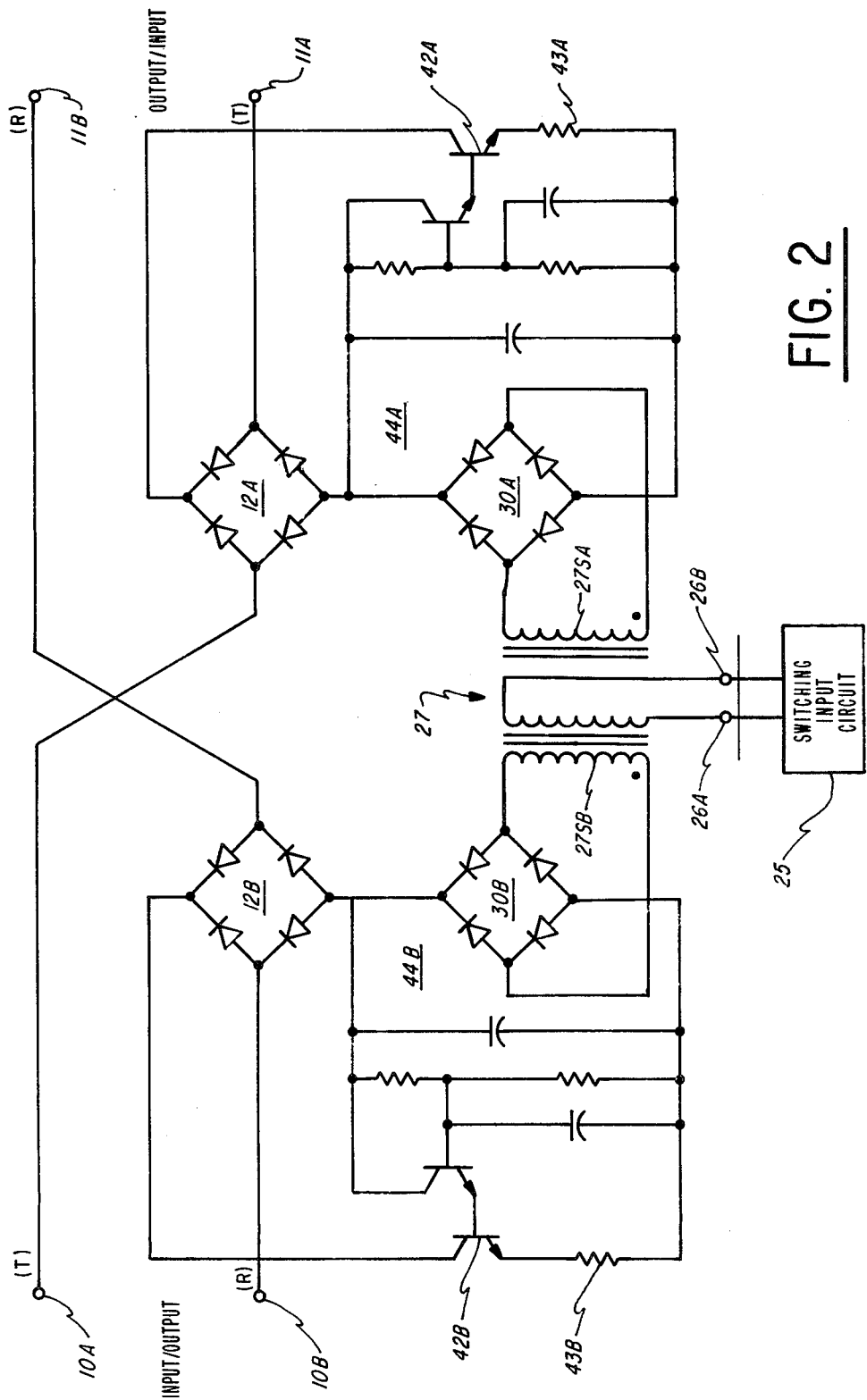
FIG. 2 is a circuit diagram that depicts the application of the bilateral switch shown in FIG. 1 to balanced lines.

Terminals 10 and 11 in FIG. 1 represent connections to an unbalanced line. As shown in FIG. 2, the switching circuit is also adapted for operation with balanced lines. By inspection, the circuitry of FIG. 2 is nearly identical to that of FIG. 1. Therefore, only certain of the elements are denoted by reference numerals in FIG. 2. Elements in FIG. 2 that are denoted by reference numerals utilize the same reference numerals as shown in FIG. 1 except for the addition of a suffix "A" or "B" required to distinguish the two circuits that are shown in FIG. 2.

In such a telephone switching circuit, the terminals 10A and 10B and terminals 11B and 11A could correspond to the tip (T) and ring (R) conductors, respectively, with the terminals 10 being connected to the customer's line and the terminals 11 being connected to other equipment at the telephone switching center. Tip signals pass through the bilateral current gate 12A, while the Ring signals pass through the bilateral current gate 12B. The circuitry associated with each of these bilateral current gates is identical to that shown in FIG. 1 but is duplicated. However, there is a difference in the transformer 27. In this case the isolation transformer has two secondaries, 27SA and 27SB. Thus, the two switches are isolated not only from the switching input circuit 25 but also from each other, except to the extent they interconnect through the customer's equipment or through the telephone switching center. Moreover, it will be apparent that switching occurs in each of the balanced lines in response to a single control signal from the input circuit 25.

Referring again to FIG. 1, this circuit is adapted for large-scale integration techniques of manufacture. An integrated circuit, for example, could be constructed with only eight terminal pins for the circuit. Pins 51a and 51b, corresponding to terminals 10 and 11, and other pins corresponding to terminals 38 and 40 would obviously be required. The remaining four terminal pins, 52, 53, 54, and 55, would constitute connections for capacitors 45 and 48, as capacitors and inductors cannot now be formed in integrated circuits. The switching input circuit 25, the transformer 27, and the capacitors 45 and 48 thus would not be included in the integrated circuit. It will also be apparent that a plurality of these switching circuits could be formed in a single, integrated circuit. Costs of integrated circuits are quite low and normally do not progress linearly with the addition of multiple circuits. Thus, the per unit switching circuit cost can be greatly reduced over discrete component circuits of the same type, and especially over the prior electromechanical relay switches. The circuitry shown in FIG. 1 and in FIG. 2 is highly reliable and is relatively simple. Moreover, the densities of the circuitry are such that the manufacture of integrated circuits is simplified. The circuitry is also subject to other types of manufacture, such as thick film or discrete component manufacture.

Therefore, there has been described a bilaterally conducting switching circuit that is the electrical equivalent of an electromechanical relay. The circuit is easy to manufacture and can switch a wide variety of signals with essentially no signal loss or signal distortion. This circuit is relatively easy and inexpensive to manufacture and is highly reliable. Moreover, it can be operated in a totally isolated condition from control circuits and yet be powered by those control circuits with a minimal impact on power supplies or other circuitry.

There has been described a specific embodiment of such a switching circuit. It will be apparent, however, that various modifications could be made to the specific circuitry that has been described with the attainment of some or all of the advantages of this invention. Therefore, it is the object of the appended claims to cover all such variations and modifications as come under the true spirit and scope of this invention.

What is claimed as new and desired to be secured by Letters Patent of the United States is:

1. A bilateral, low loss, wide band switching circuit for conveying signals between first and second terminal means in response to a switching signal at a third terminal means, said switching circuit comprising:

A. bilateral current gate means having first and second parallel, unidirectional, conducting path means for conveying DC current from an input junction means to an output junction means, each path means including a pair of diode means with the junction between each pair defining a balance point junction means, each said balance point junction means connecting to one of said first and second terminal means;

B. full-wave rectifier means including a plurality of diode means for generating, at an output means, a DC current in response to signals at input means, said output means being connected to said input junction means of said bilateral current gate means;

C. control signal circuit means connected to said third terminal means and to said input means of said full-wave rectifier means for energizing said full-wave rectifier means in response to the switching signal thereby to forward bias the first and second unidirectional current path means in said bilateral current gate means; and D. controllable switch means comprising:
  (i) switching transistor means connected to said output junction of said bilateral current gate means and the input means of said full-wave rectifier means for forming a current path between said output junction of said bilateral current gate means and said full-wave rectifier means, and
  (ii) control circuit means connected to said full-wave rectifier means and said switching transistor means for controlling conduction through said switching transistor means to forward bias the first and second unidirectional current path means in said bilateral current gate means, said control circuit means including:
    (a) bias transistor means connected to said switching transistor means, and
    (b) filter means connected to said bias transistor and said full-wave rectifier means, said filter means controlling said bias transistor means in response to a signal from said full-wave rectifier means produced in response to the switching signal.

2. A bilateral, low loss, wide band switching circuit as recited in claim 1 wherein said control signal circuit means comprises isolating signal transfer means for transferring the switching signal to said controllable switch means while electrically isolating said controllable switch means.

3. A bilateral, low loss, wide band switching circuit as recited in claim 1 wherein said control signal circuit means includes transformer means connected to receive the switching signal from said third terminal means and rectifier means connected to said transformer means and in series with said controllable switching circuit means and said bilateral current gate means for forward biasing said diodes in said first and second unidirectional current paths.

4. A bilateral, low loss, wide band switching circuit as recited in claim 1 wherein said controllable switch means further includes resistor means interconnecting said switching transistor means and said bilateral current gate means for establishing the magnitude of the forward bias current through said bilateral current gate means.

5. A bilateral, low loss, wide band switching network for switching signals in balanced transmission lines, each transmission line having first and second terminal means and said switching network additionally including third terminal means for receiving switching signals, said switching network comprising:

A. first and second bilateral current gate means, each having first and second parallel, unidirectional, conducting path means for conveying DC current from an input junction means to an output junction means, each path means including a pair of diode means with the junction between each pair defining a balance point junction means, each said balance point junction means connecting to one of said first and second terminal means;

B. first and second rectifier means each including a plurality of diode means for producing a DC signal at an output means connected to said input junction means of a corresponding one of said bilateral current conducting means in response to a signal at input means;

C. control signal circuit means connected to said third terminal means and to said input means of said first and second full-wave rectifier means for energizing both said full-wave rectifier means in response to the switching signals thereby to forward bias the first and second unidirectional current path means in each of said bilateral current gate means; and D. first and second controllable switch means each comprising:
   (i) switching transistor means connected to said output junction of a respective bilateral current gate means and the input means of said full-wave rectifier means for forming a current path between the output junction of the respective bilateral current gate means and the corresponding full-wave rectifier means, and
   (ii) control circuit means connected to the corresponding full-wave rectifier means and the switching transistor means for controlling conduction through said switching transistor means to forward bias the first and second unidirectional current path means in the respective bilateral current gate means, said control circuit means including:
      (a) bias transistor means connected to said switching transistor means, and
      (b) filter means connected to said bias transistor and said full-wave rectifier means, said filter means controlling said bias transistor means in response to a signal from said full-wave rectifier means produced in response to the switching signal.

6. A bilateral, low loss, wide band switching circuit as recited in claim 5 wherein said control signal circuit means comprises isolating signal transfer means for transferring the switching signal to both said controllable switch means while electrically isolating said controllable switch means.

7. A bilateral, low loss, wide band, switching network as recited in claim 5 wherein said network includes a switching signal circuit and said control signal circuit means includes transformer means having a primary means connected to receive the switching signal and having first and second independent secondary winding means connected, respectively, to said first and second rectifier means and in series with said controllable switch means and said corresponding bilateral current gate means for forward biasing said diodes in said first and second unidirectional current paths.

8. A bilateral, low loss, wide band switching network as recited in claim 7 wherein each said controllable switch means further includes resistor means interconnecting each of said corresponding switching transistor means and bilateral current gate means for establishing the magnitude of the forward bias current through said diode means.

* * * * *